(12) United States Patent
Perng et al.

(10) Patent No.: US 9,093,450 B2
(45) Date of Patent: Jul. 28, 2015

(54) CHIP PACKAGE AND MANUFACTURING METHOD THEREOF

(71) Applicant: XINTEC INC., Jhongli, Taoyuan County (TW)

(72) Inventors: Baw-Ching Perng, Baoshan Township (TW); Ying-Nan Wen, Hsinchu (TW); Shu-Ming Chang, Tucheng Dist (TW)

(73) Assignee: XINTEC INC., Taoyuan (TW)

( * ) Notice: Subject to any disclaimer, the term of this patent is extended or adjusted under 35 U.S.C. 154(b) by 0 days.

(21) Appl. No.: 14/077,877

(22) Filed: Nov. 12, 2013

(65) Prior Publication Data

US 2014/0073089 A1 Mar. 13, 2014

Related U.S. Application Data

(62) Division of application No. 12/957,159, filed on Nov. 30, 2010, now Pat. No. 8,610,271.

(60) Provisional application No. 61/265,277, filed on Nov. 30, 2009.

(51) Int. Cl.
*H01L 21/50* (2006.01)
*H01L 25/00* (2006.01)
(Continued)

(52) U.S. Cl.
CPC ............ *H01L 25/50* (2013.01); *B81C 1/0023* (2013.01); *H01L 21/6835* (2013.01); *H01L 24/94* (2013.01); *B81B 2207/012* (2013.01); *B81B 2207/07* (2013.01); *B81B 2207/098* (2013.01); *B81C 2203/0109* (2013.01); *B81C 2203/0792* (2013.01); *H01L 2224/32145* (2013.01); *H01L 2224/48091* (2013.01); *H01L 2224/48145* (2013.01); *H01L 2224/48227* (2013.01); *H01L 2924/014* (2013.01); *H01L 2924/01006* (2013.01); *H01L 2924/01013* (2013.01); *H01L 2924/01021* (2013.01);*H01L 2924/01029* (2013.01); *H01L 2924/01033* (2013.01); *H01L 2924/01079* (2013.01);
(Continued)

(58) Field of Classification Search
CPC ......... H01L 23/02; H01L 21/58; H01L 23/48; H01L 25/00; H01L 21/00; H01L 21/44; H01L 21/48; H01L 21/50
USPC .................................. 438/107, 686, 777, 723
See application file for complete search history.

(56) References Cited

U.S. PATENT DOCUMENTS 6,841,858 B2 1/2005 Shim et al.
6,919,627 B2 7/2005 Liu et al.
(Continued)

FOREIGN PATENT DOCUMENTS

CN 1674277 9/2005

*Primary Examiner* — Chuong A Luu
(74) *Attorney, Agent, or Firm* — Liu & Liu

(57) ABSTRACT

A chip package includes a substrate having an upper and a lower surface and including: at least a first contact pad; a non-optical sensor chip disposed overlying the upper surface, wherein the non-optical sensor chip includes at least a second contact pad and has a first length; a protective cap disposed overlying the non-optical sensor chip, wherein the protective cap has a second length, an extending direction of the second length is substantially parallel to that of the first length, and the second length is shorter than the first length; an IC chip disposed overlying the protective cap, wherein the IC chip includes at least a third contact pad and has a third length, and an extending direction of the third length is substantially parallel to that of the first length; and bonding wires forming electrical connections between the substrate, the non-optical sensor chip, and the IC chip.

11 Claims, 11 Drawing Sheets

(51) Int. Cl.
*B81C 1/00* (2006.01)
*H01L 21/683* (2006.01)
*H01L 23/00* (2006.01)

(52) U.S. Cl.
CPC ............. *H01L 2924/01082* (2013.01); *H01L 2924/09701* (2013.01); *H01L 2924/14* (2013.01); *H01L 2924/1433* (2013.01); *H01L 2924/1461* (2013.01); *H01L 2924/15311* (2013.01); *H01L 2924/16235* (2013.01)

(56) References Cited

U.S. PATENT DOCUMENTS

| | | | |
|---|---|---|---|
| 7,034,388 B2 | 4/2006 | Yang et al. | |
| 7,405,486 B2 | 7/2008 | Kato | |
| 2004/0251531 A1* | 12/2004 | Yang et al. | 257/686 |
| 2005/0212110 A1* | 9/2005 | Kato | 257/686 |
| 2007/0037321 A1* | 2/2007 | Higashino et al. | 438/109 |
| 2008/0283993 A1 | 11/2008 | Sanchez et al. | |

* cited by examiner

CHIP PACKAGE AND MANUFACTURING METHOD THEREOF

CROSS REFERENCE

This Application is a Divisional of U.S. application Ser. No. 12/957,159, filed on Nov. 30, 2010 now U.S. Pat. No. 8,610,271 and entitled "CHIP PACKAGE AND MANUFACTURING METHOD THEREOF", which claims the benefit of U.S. Provisional Application No. 61/265,277, filed on Nov. 30, 2009, the entirety of which are incorporated by reference herein.

BACKGROUND OF THE INVENTION

1. Field of the Invention

The present invention relates to a chip package, and in particular relates to a chip package of a non-optical sensor chip.

2. Description of the Related Art

Electronic products are developed to be lighter, thinner, shorter, and smaller. Semiconductor chips now tend to consist of multi-chip packages to achieve multi-functional and high performance requirements. A multi-chip package includes a variety of chips, such as logic chips, an analog chip, control chips, or memory chips which are all integrated into a single chip package.

For example, for conventional technology, a micro electro-mechanical system sensor chip (MEMS sensor chip) and an application specific integrated circuit (ASIC) are commonly integrated together on a printed circuit board.

However, when more chips are integrated together, the size of the package cannot be reduced effectively if the chips are integrated two-dimensionally on a package substrate. Too much area of the package substrate is occupied such that manufacturing cost is increased, which adversely affects applications in portable electronic products.

BRIEF SUMMARY OF THE INVENTION

According to an embodiment of the invention, a chip package is provided. The chip package includes a substrate having an upper surface and a lower surface, wherein the substrate includes at least a first contact pad; a non-optical sensor chip disposed overlying the upper surface of the substrate, wherein the non-optical sensor chip comprises at least a second contact pad and has a first length; a protective cap disposed overlying the non-optical sensor chip, wherein the protective cap has a second length, an extending direction of the second length is substantially parallel to an extending direction of the first length, and the second length is shorter than the first length; an IC chip disposed overlying the protective cap, wherein the IC chip comprises at least a third contact pad and has a third length, and an extending direction of the third length is substantially parallel to the extending direction of the first length; and a plurality of bonding wires forming electrical connections between the substrate, the non-optical sensor chip, and the IC chip.

According to an illustrative embodiment, a method for forming a chip package is provided. The method includes: providing a substrate having an upper surface and a lower surface, wherein the substrate comprises at least a first contact pad; disposing a non-optical sensor chip overlying the upper surface of the substrate, wherein the non-optical sensor chip comprises at least a second contact pad and has a first length; disposing a protective cap overlying the non-optical sensor chip, wherein the protective cap has a second length, an extending direction of the second length is substantially parallel to an extending direction of the first length, and the second length is shorter than the first length; disposing an IC chip overlying the protective cap, wherein the IC chip comprises at least a third contact pad, the IC chip has a third length, and an extending direction of the third length is substantially parallel to the extending direction of the first length; and forming a plurality of bonding wires, wherein the bonding wires form electrical connections between the substrate, the non-optical sensor chip, and the IC chip.

According to an illustrative embodiment, a method for forming a chip package is provided. The method includes: providing a substrate, wherein the substrate comprises at least a first contact pad; providing a semiconductor wafer comprising a plurality of non-optical sensor chips, wherein each of the non-optical sensor chips comprises at least a second contact pad, and each of the non-optical sensor chips has a first length; disposing a plurality of protective caps overlying the semiconductor wafer, wherein the protective caps are disposed overlying at least one of the non-optical sensor chips, respectively, each of the protective caps has a second length, an extending direction of the second length is substantially parallel to an extending direction of the first length, and the second length is shorter than the first length; disposing a plurality of IC chips overlying the semiconductor wafer, wherein the IC chips are disposed overlying one of the protective caps, respectively, each of the IC chips comprises at least a third contact pads and has a third length, and an extending direction of the third length is substantially parallel to the extending direction of the first length; dicing the semiconductor wafer to separate the non-optical sensor chips; disposing one of the separated non-optical sensor chips overlying the substrate; and forming a plurality of bonding wires, wherein the bonding wires form electrical connections between the substrate, the separated non-optical sensor chip, and the IC chip.

According to an illustrative embodiment, a method for forming a chip package is provided. The method includes: providing a substrate, wherein the substrate comprises at least a first contact pad; providing a semiconductor wafer comprising a plurality of non-optical sensor chips, wherein each of the non-optical sensor chips comprises at least a second contact pad, and each of the non-optical sensor chips has a first length; disposing a plurality of protective caps overlying the semiconductor wafer, wherein the protective caps are disposed overlying at least one of the non-optical sensor chips, respectively, each of the protective caps has a second length, an extending direction of the second length is substantially parallel to an extending direction of the first length, and the second length is shorter than the first length; dicing the semiconductor wafer to separate the non-optical sensor chips; disposing an IC chip overlying one of the non-optical sensor chips, wherein the IC chip is disposed overlying the protective cap of one of the separated non-optical sensor chips, the IC chip comprises at least a third contact pad and has a third length, and an extending direction of the third length is substantially parallel to the extending direction of the first length; disposing one of the separated non-optical sensor chips overlying the substrate; and forming a plurality of bonding wires, wherein the bonding wires form electrical connections between the substrate, the separated non-optical sensor chip, and the IC chip.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

It is understood, that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numbers and/or letters in the various examples. This repetition is for the purpose of simplicity and clarity and does not in itself dictate a relationship between the various embodiments and/or configurations discussed. Furthermore, descriptions of a first layer "on," "overlying," (and like descriptions) a second layer include embodiments where the first and second layers are in direct contact and those where one or more layers are interposing the first and second layers.

Figure 1:
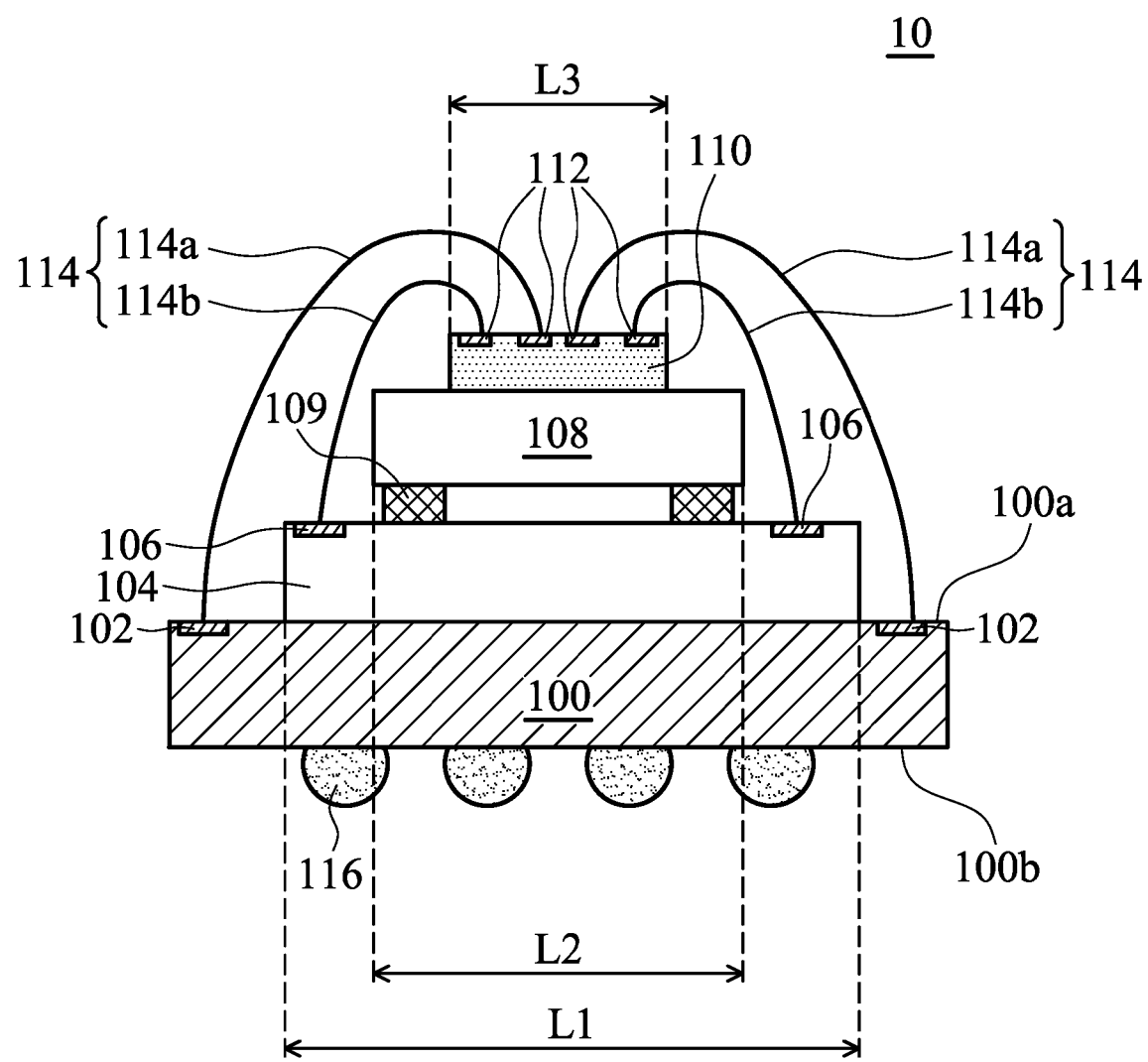
FIG. 1 is a cross-sectional view showing a chip package according to an embodiment of the present invention.

FIG. 1 is a cross-sectional view showing a chip package 10 according to an embodiment of the present invention. In this embodiment, the chip package 10 includes a substrate 100 which has an upper surface 100a and an opposite lower surface 100b. The substrate 100 may include a semiconductor material, ceramic material, polymer material, or combinations thereof. In one embodiment, the substrate 100 is a printed circuit board. The substrate 100 further includes at least a first contact pad 102 for receiving or transmitting electrical signals.

As shown in FIG. 1, the chip package 10 further includes a non-optical sensor chip 104 disposed overlying the upper surface 100a of the substrate 100. The non-optical sensor chip 104 includes at least a second contact pad 106 for receiving or transmitting electrical signals. For example, a conducting route between the first contact pad 102 and the second contact pad 106 may be achieved by a bonding wire such that electrical signals may be transmitted between the non-optical sensor chip 104 and the substrate 100 (such as a printed circuit board). In this embodiment, the non-optical sensor chip 104 has a first length L1.

The non-optical sensor chip 104 includes any sensor chip which is not applied to the receiving or emitting of light. For example, the non-optical sensor chip 104 may be a MEMS sensor chip. In addition, the non-optical sensor chip 104 may include a micro fluidic system chip, physical sensor chip for detecting physical changes such as detecting heat, light, or pressure, RF device chip, accelerator chip, gyroscope chip, micro actuator chip, surface acoustic wave device chip, or pressure sensor chip. However, it should be noted that an optical chip may be adopted to replace the non-optical sensor chip 104 depending on requirement. For example, an image capture chip, light emitting chip, or solar cell chip may be disposed overlying the substrate 100.

As shown in FIG. 1, a protective cap 108 is disposed overlying the non-optical sensor chip 104 to protect the non-optical sensor chip 104 from being damaged. The protective cap 108 has a second length L2. The extending direction of the second length L2 is substantially parallel to the extending direction of the first length L1 of the non-optical sensor chip 104. The second length L2 needs to be shorter than the first length L1. In this embodiment, because the second length L2 is shorter than the first length L1, the protective cap 108 is prevented from covering the contact pad 106 on the non-optical sensor chip 104 to adversely affect the subsequent formation of a bonding wire. However, it is not necessary for the protective cap to be completely shorter than the non-optical sensor chip 104. The protective cap 108 only needs to be shorter than the non-optical sensor chip 104 along the extending direction substantially parallel to the first length L1. The portion of the protective pad 108 that does not cover the contact pad 106 may have a size longer than the non-optical sensor chip 104, depending on requirement.

The material of the protective cap 108 may be, for example, a glass material, metal material, ceramic material, polymer material, semiconductor material, or combinations thereof. In this embodiment, the protective cap 108 is disposed overlying the non-optical sensor chip 104 through a spacer structure 109. The protective cap 108, the spacer structure 109, and the non-optical sensor chip 104 together surround a sealed space. In one embodiment, a portion of the non-optical sensor chip 104 may operate within the sealed space. The material of the spacer structure 109 may include a glass material, metal material, ceramic material, polymer material, semiconductor material, or combinations thereof. The spacer structure 109 may be fixed between the protective cap 108 and the non-optical sensor chip 104 by an adhesion layer. Alternatively, the spacer structure 109 may be adhesive. For example, the spacer structure 109 may be an adhesive polymer. In addition, a curing process may be performed to harden the adhesive polymer spacer structure 109. For example, the spacer structure 109 may be cured by heating or irradiation with a light.

As shown in FIG. 1, the chip package 10 further includes an IC chip 110 disposed overlying the protective cap 108. The IC chip 110 has at least a third contact pad 112 for receiving or transmitting electrical signals. For example, a conducting route between the first contact pad 102 and the third contact pad 112 may be achieved by a bonding wire such that electrical signals may be transmitted between the non-optical sensor chip 104 and the substrate 100 (such as a printed circuit board). Alternatively, a conducting route between the second contact pad 106 and the third contact pad 112 may be achieved by a bonding wire such that electrical signals may be transmitted between the non-optical sensor chip 104 and the substrate 100 (such as a printed circuit board). In this embodiment, the IC chip 110 has a third length L3. In this embodiment, the extending direction of the third length L3 is substantially parallel to the extending direction of the first length L1 of the non-optical sensor chip 104. The third length L3 is shorter than the first length L1. The IC chip 110 includes, for example, an ASIC chip used to process electrical signals input to and/or output from the non-optical sensor chip 104 and/or the substrate (such as a printed circuit board).

The chip package 10 shown in FIG. 1 includes a plurality of bonding wires 114, wherein the bonding wires 114a electrically contact one of the first contact pads 102 and one of the third contact pads 112, respectively. The bonding wires 114b electrically contact one of the second contact pads 106 and one of the third contact pads 112, respectively. The material of the bonding wires 114 may include a metal material, such as gold, copper, aluminum, or combinations thereof. The bonding wires 114 may be formed using typical wire bonding process. In one embodiment, the chip package 10 may be disposed overlying another electronic device through a soldering ball 116 providing a desired electrical connection.

Figure 2:
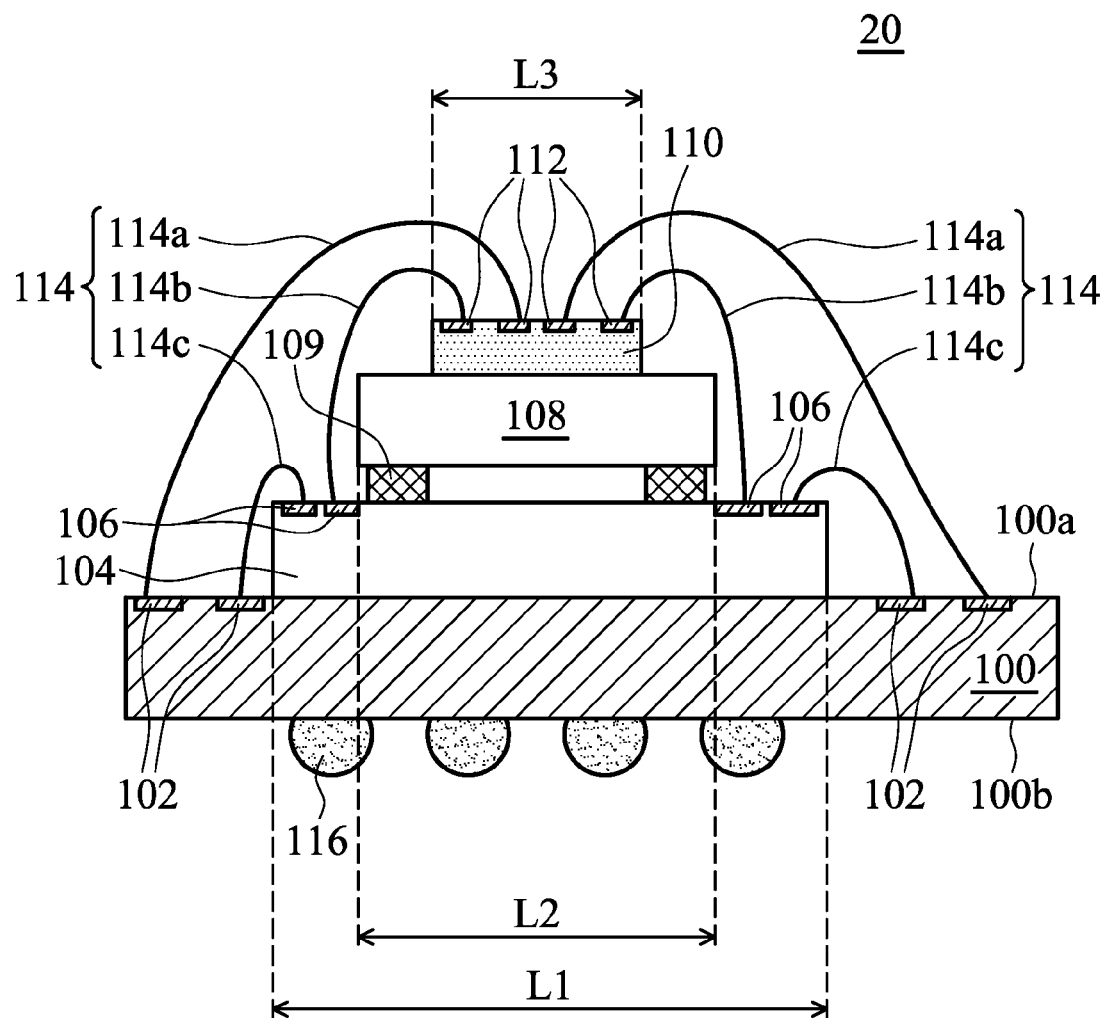
FIG. 2 is a cross-sectional view showing a chip package according to an embodiment of the present invention.

FIG. 2 is a cross-sectional view showing a chip package 20 according to another embodiment of the present invention, wherein same or similar reference numbers are used to designate same or similar elements. The chip package 20 has a structure similar to that of the chip package 10. The main difference therebetween is that the chip package 20 further includes a bonding wire 114c which electrically contacts the one of the first contact pads 102 and one of the second contact pads 106, respectively. The bonding wire 114c may be used to transmit electrical signals between the substrate (such as a printed circuit board) and the non-optical sensor chip 104.

In the embodiments shown in FIGS. 1 and 2, each of the third lengths L3 of the IC chips 110 is shorter than each of the first lengths L1 of the non-optical sensor chips 104. However, embodiments of the present invention are not limited thereto. In another embodiment, the third length L3 of the IC chip may be longer than or equal to the first length L1 of the non-optical sensor chip 104, such as the embodiments shown in FIGS. 3 and 4.

Figure 3:
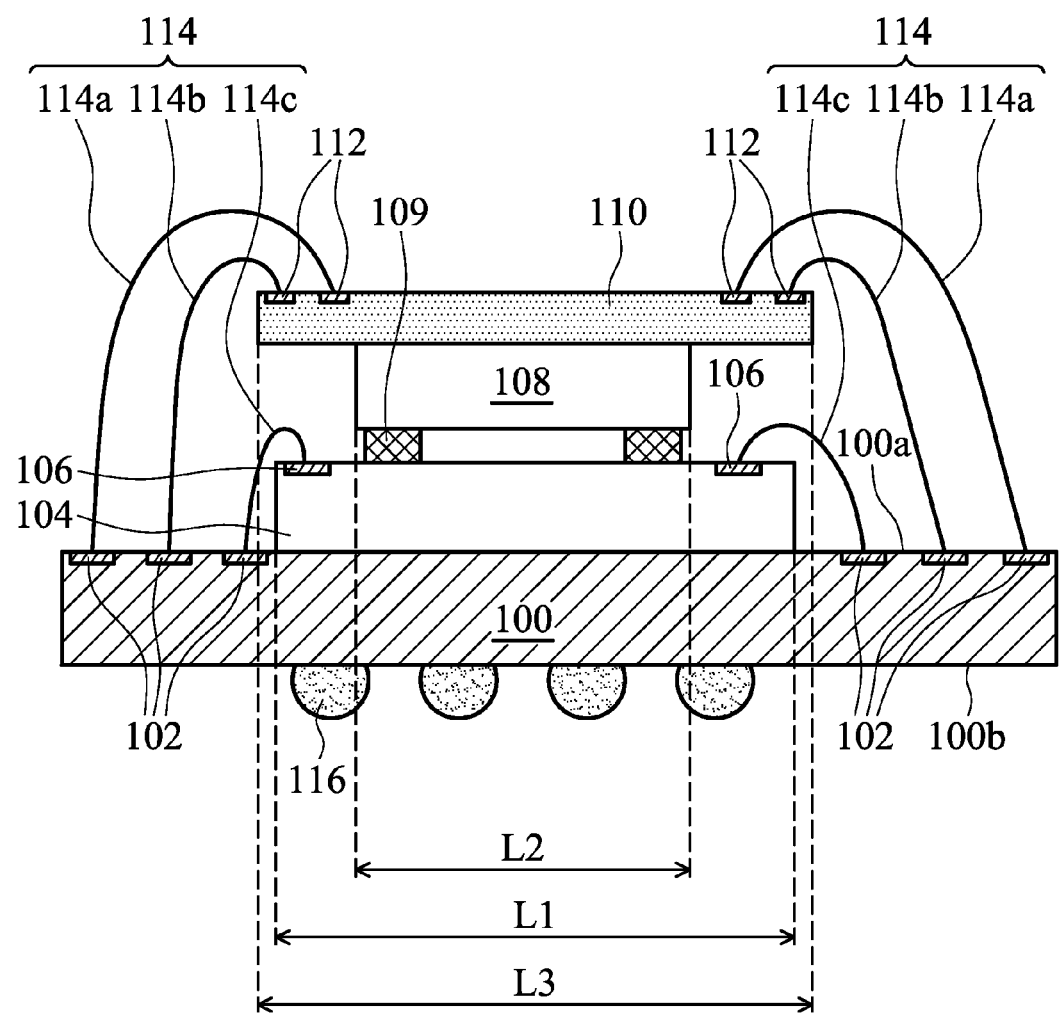
FIG. 3 is a cross-sectional view showing a chip package according to an embodiment of the present invention.

FIG. 3 is a cross-sectional view showing a chip package 30 according to an embodiment of the present invention, wherein the chip package 30 has a structure similar to that of the chip package 10 or 20. In this embodiment, the third length L3 of the IC chip 110 is longer than the first length L1 of the non-optical sensor chip 104. Because the third length L3 is longer than the first length L1, no bonding wire can be formed between the second contact pad 106 and the third contact pad 112, unlike the embodiment shown in FIG. 1 or 2. In this case, in order to ensure that electrical signals can be transmitted between the IC chip 110 and the non-optical sensor chip 104 smoothly, electrical connections to the substrate 100 may be achieved first through the bonding wires 114b and 114c, respectively. Then, electrical signals are transmitted to each other through different contact pads in the substrate 100.

Figure 4:
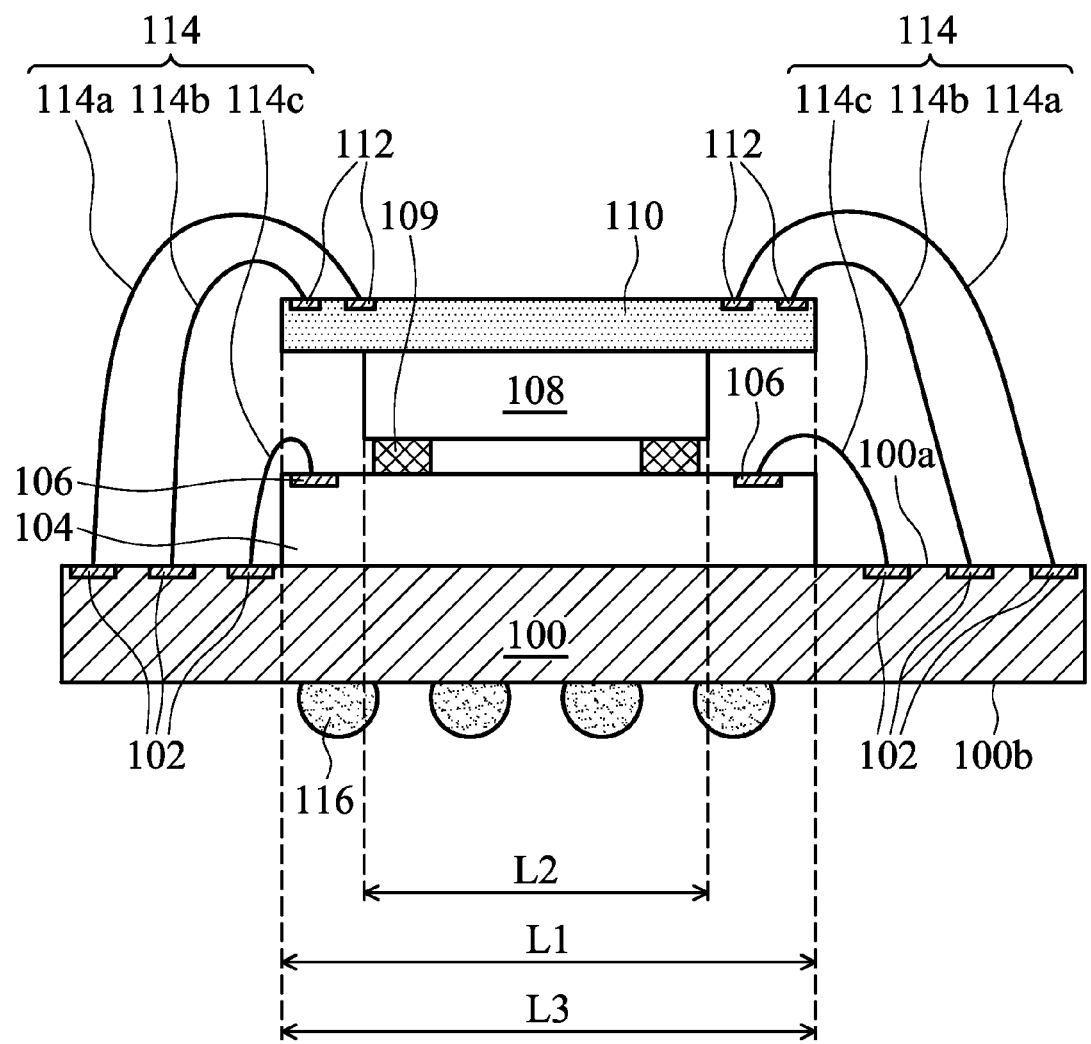
FIG. 4 is a cross-sectional view showing a chip package according to an embodiment of the present invention.

In addition, in one embodiment of the invention, the third length L3 of the IC chip 110 may be substantially equal to the first length L1 of the non-optical sensor chip 104, such as that shown in the cross-sectional view of a chip package 40 in FIG. 4, wherein same or similar reference numbers are used to designate same or similar elements. In this case, electrical connections to the substrate 100 may also be achieved first through the bonding wires 114b and 114c, respectively. Then, electrical signals are transmitted to each other through different contact pads in the substrate 100.

Figure 5:
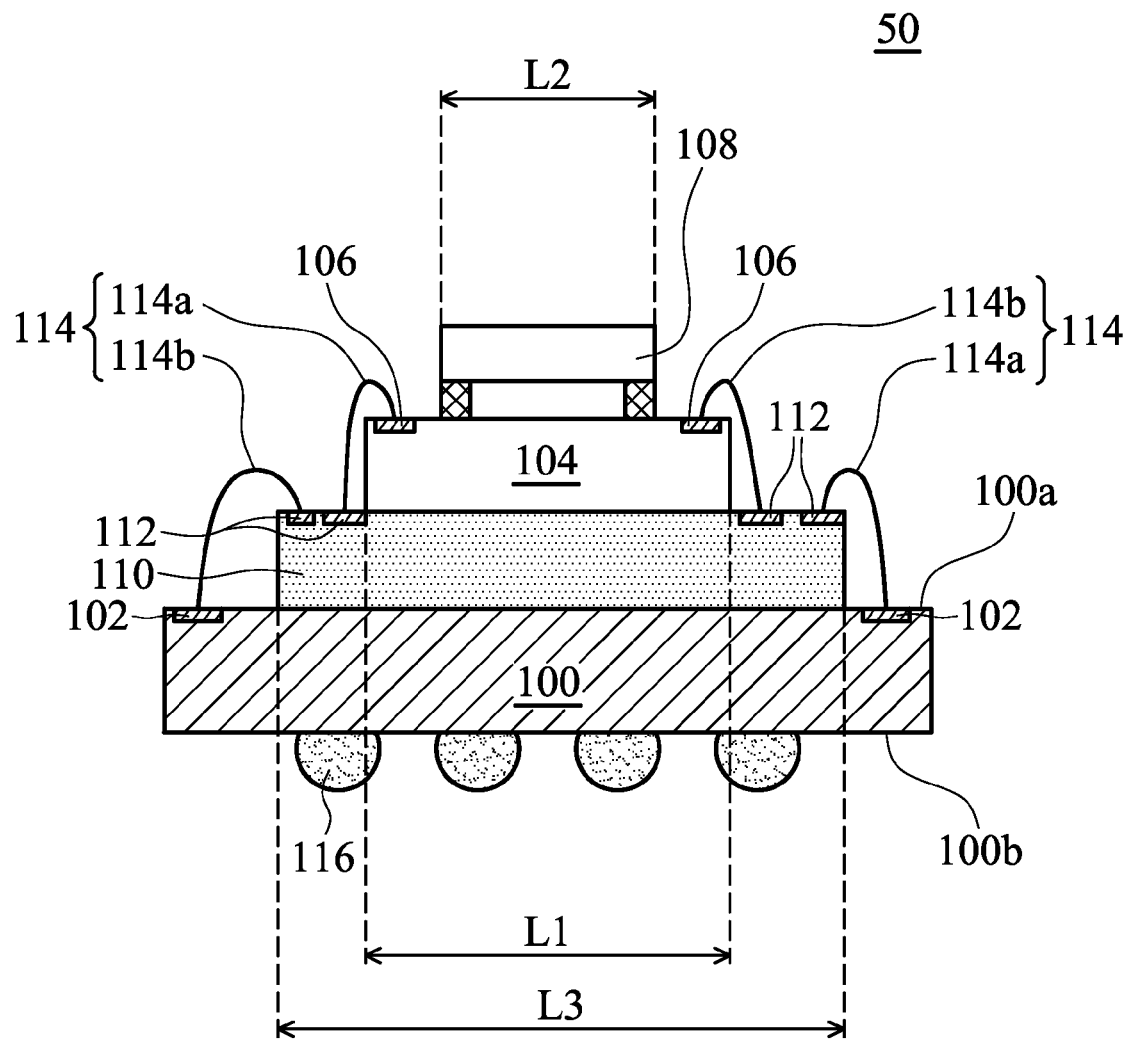
FIG. 5 is a cross-sectional view showing a chip package according to an embodiment of the present invention.

In addition, in another embodiment of the invention, the locations of the non-optical sensor chip 104 and the IC chip 110 may be exchanged, as that shown in the cross-sectional view of a chip package 50 in FIG. 5. As shown in FIG. 5, the IC chip 110 is disposed between the non-optical sensor chip 104 and the substrate 100. In this case, the third length L3 of the IC chip 110 needs to be longer than the first length L1 of the non-optical sensor chip 104.

A method for forming a chip package 10 according to an embodiment of the invention will be described with references made to FIG. 1. The chip packages 20, 30, and 40 shown in FIGS. 2-4 may be formed by a similar method. First, a substrate 100 having an upper surface 100a and a lower surface 100b is provided. The substrate 100 includes at least a first contact pad 102. Then, a non-optical sensor chip 104 is disposed overlying the upper surface 100a of the substrate 100, wherein the non-optical sensor chip 104 includes at least a second contact pad 106 and has a first length L1. Then, a protective cap 108 is disposed overlying the non-optical sensor chip 104. The protective cap 108 has a second length L2, wherein the extending direction of the second length L2 is substantially parallel to the extending direction of the first length L1. The second length L2 is shorter than the first length L1. Then, an IC chip 110 is disposed overlying the protective cap 108. The IC chip 110 includes at least a third contact pad 112 and has a third length L3. The extending direction of the third length L3 is substantially parallel to the extending direction of the first length L1. Then, a plurality of bonding wires 114 are formed, which form electrical connections between the substrate 100, the non-optical sensor chip 104, and the IC chip 110.

In one embodiment, after the substrate 100, the non-optical sensor chip 104, the protective cap 108, and the IC chip 110 are disposed, the desired bonding wires 114 are formed on the contact pads of the substrate 100, the non-optical sensor chip 104, and the IC chip 110 through, for example, a wire bonding process. However, embodiments of the present invention are not limited thereto. In another embodiment, the bonding wires are formed stepwise to form electrical connections between different chips or between chips and the substrate. Take the embodiment shown in FIG. 3 as an example, before disposing the IC chip 110, a terminal of the bonding wire 114a is first electrically connected to one of the first contact pads 102. After the IC chip 110 is disposed thereon, the other terminal of the bonding wire 114a is electrically connected to one of the third contact pads 112.

Figure 6A:
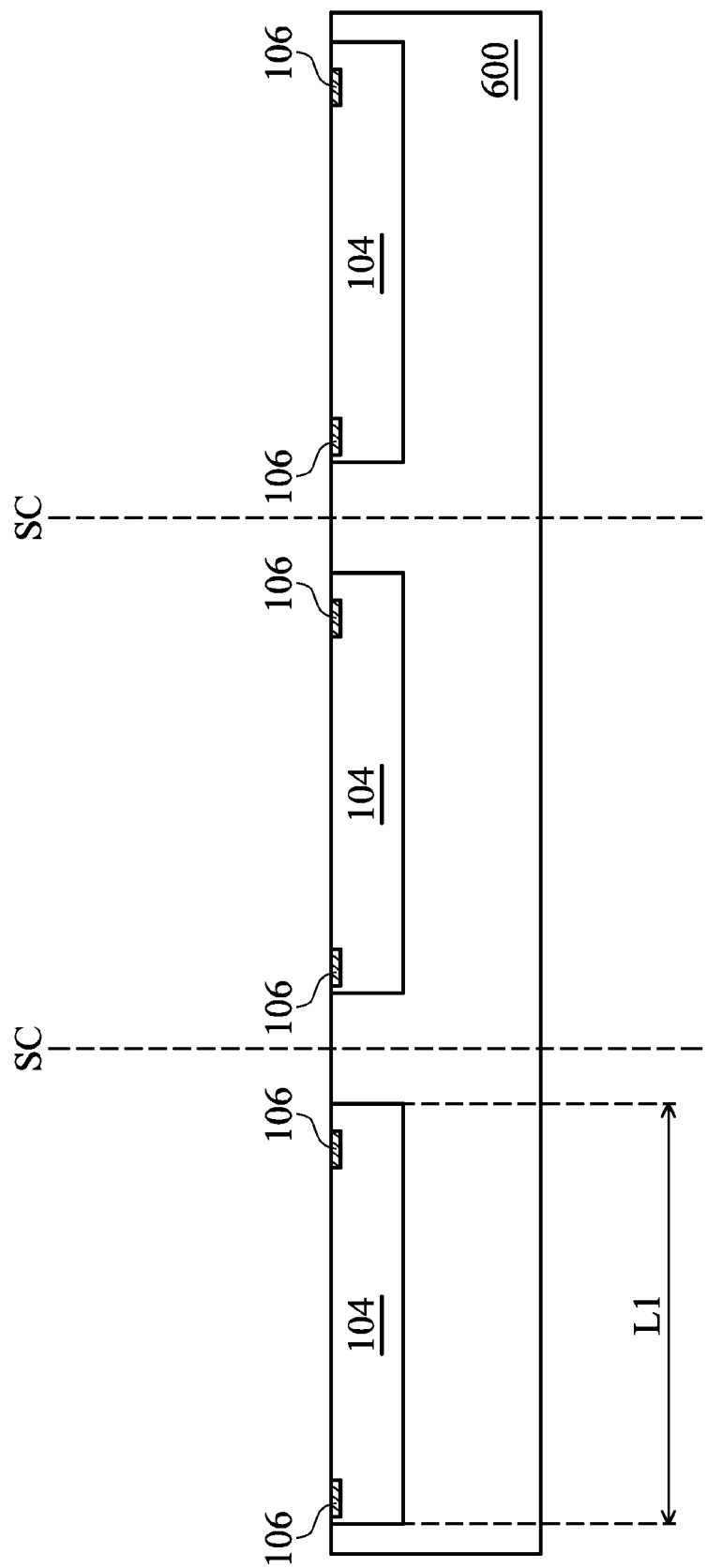
FIGS. 6A-6C are cross-sectional views showing the steps of forming a chip package according to an embodiment of the present invention.
Figure 6B:
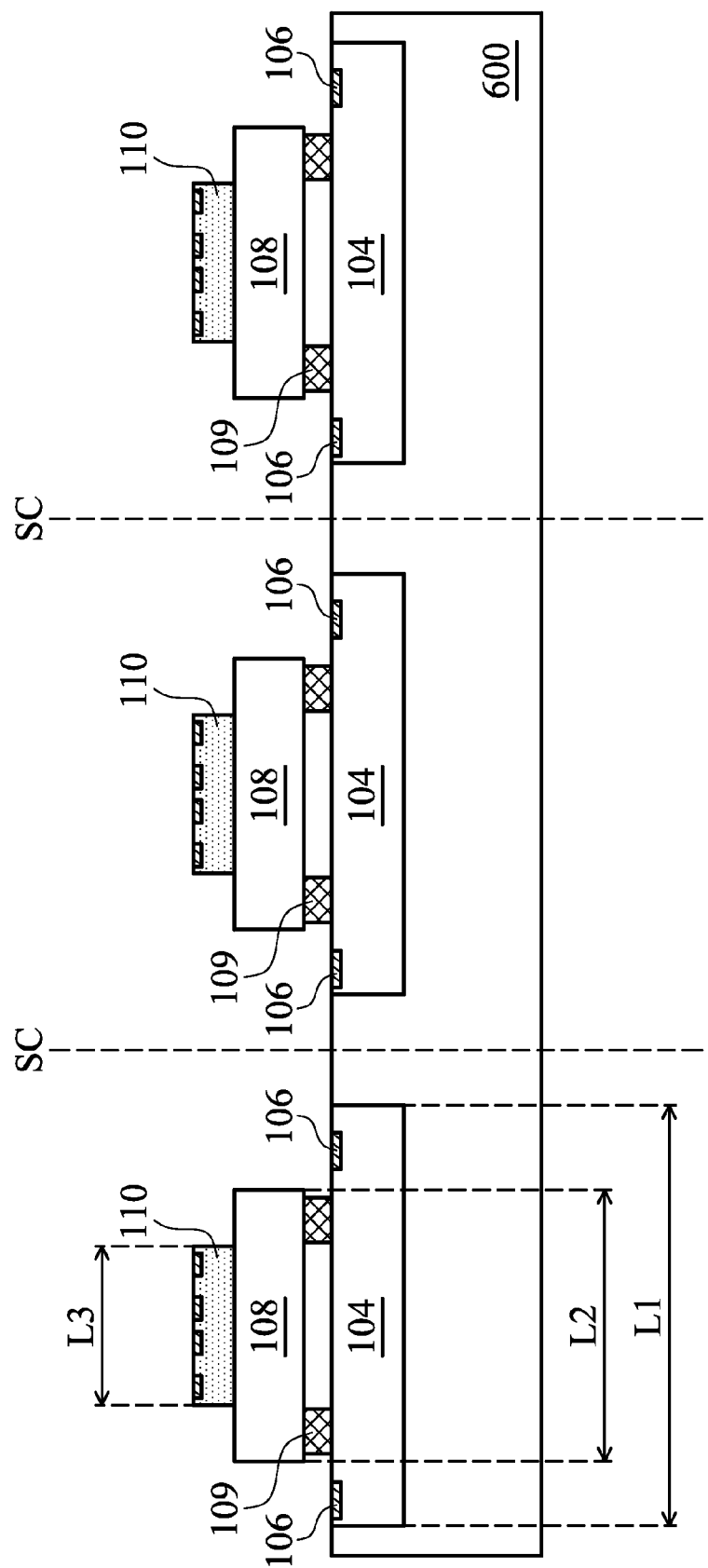
Figure 6C:
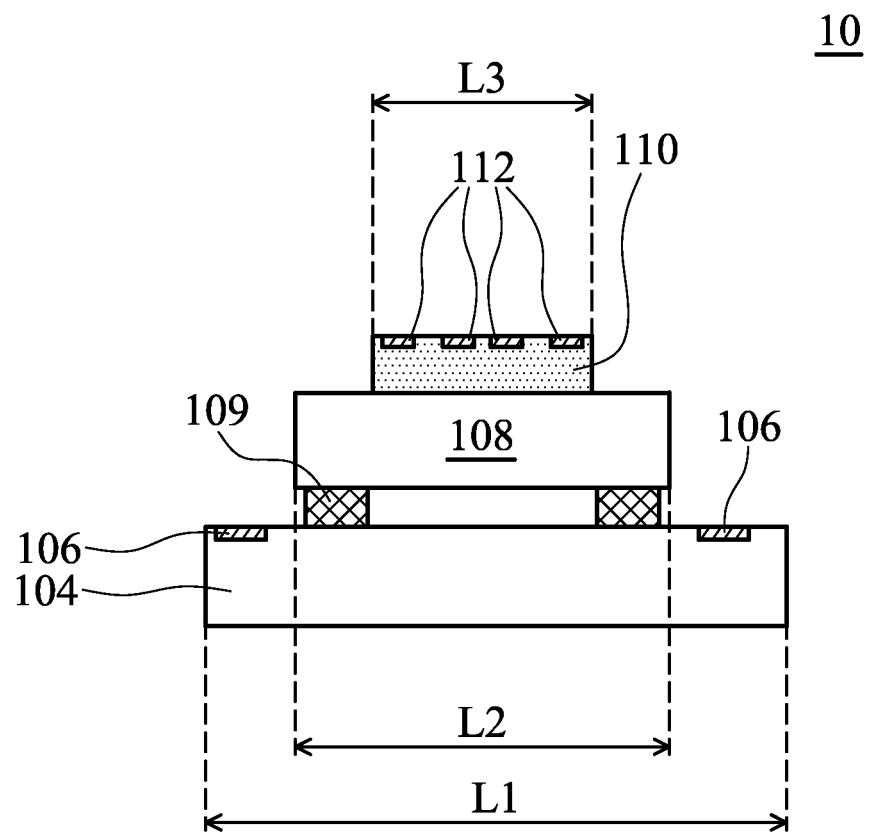

In addition, it is preferable that the chip package according to an embodiment of the invention is formed by a wafer-level packaging to reduce manufacturing time and cost and increase product yields. FIGS. 6A-6C are cross-sectional views showing the steps of forming a chip package according to an embodiment of the present invention, wherein same or similar reference numbers are used to designate same or similar elements.

As shown in FIG. 6A, a semiconductor wafer 600 is first provided, which includes a plurality of non-optical sensor chips 104. Each of the non-optical sensor chips 104 includes at least a second contact pad 106, and each of the non-optical sensor chips 104 has a first length L1.

Then, as shown in FIG. 6B, a plurality of protective caps 108 are disposed overlying the semiconductor wafer 600. For example, the protective caps 108 are respectively disposed overlying at least one of the non-optical sensor chips 104 through spacer structures 109. Each of the protective caps 108 has a second length L2. The extending direction of the second length L2 is substantially parallel to the extending direction of the first length L1. The second length L2 is shorter than the first length L1.

Still referring to FIG. 6B, a plurality of IC chips 110 are then disposed overlying the semiconductor wafer 600. The IC chips 110 are disposed overlying one of the protective caps 108, respectively. Each of the IC chips 110 includes at least a third contact pad (not shown, to see the third contact pad 112 in FIG. 1, for example) and has a third length L3. The extending direction of the third length L3 is substantially parallel to the extending direction of the first length L1. In this embodiment, the third length L3 is shorter than the first length L1. However, in another embodiment, the third length L3 is longer than or equal to the first length L1 (such as that shown in FIG. 3 or 4).

Then, the semiconductor wafer 600 may be diced along predetermined scribe lines SC in FIG. 6B to separate the non-optical sensor chips 104. In addition, before or after the non-optical sensor chips 104 are separated, the semiconductor wafer 600 may be optionally grinded to remove excess portion of the semiconductor wafer 600. The obtained separated non-optical sensor chips 104 are shown in FIG. 6C.

A following process is described with references made to FIG. 1. A substrate 100 is provided. The substrate 100 includes at least a first contact pad 102. One of the separated non-optical sensor chips 104 (such as that shown in FIG. 6C) is disposed overlying the substrate 100. A plurality of bonding wires 114 are formed. The bonding wires 114 form electrical connections between the substrate 100, one of the separated non-optical sensor chips 104, and the IC chip 110. As shown in FIG. 1, a soldering ball 116 may be formed overlying the lower surface 100b of the substrate 100. In addition, it should be noted that the separated non-optical sensor chips 104 obtained in FIG. 6C may not only be packaged through the method shown in FIG. 1, but also may be packaged through any one of the methods shown in FIGS. 2-4.

In the embodiment shown in FIGS. 6A-6C, the protective caps 108 and the IC chips 110 are disposed in a wafer-level packaging process. The plurality of protective caps 108 and the plurality of IC chips 110 may be stacked overlying the semiconductor wafer 600 in a single disposing process, respectively; thus reducing manufacturing time and cost.

Figure 7A:
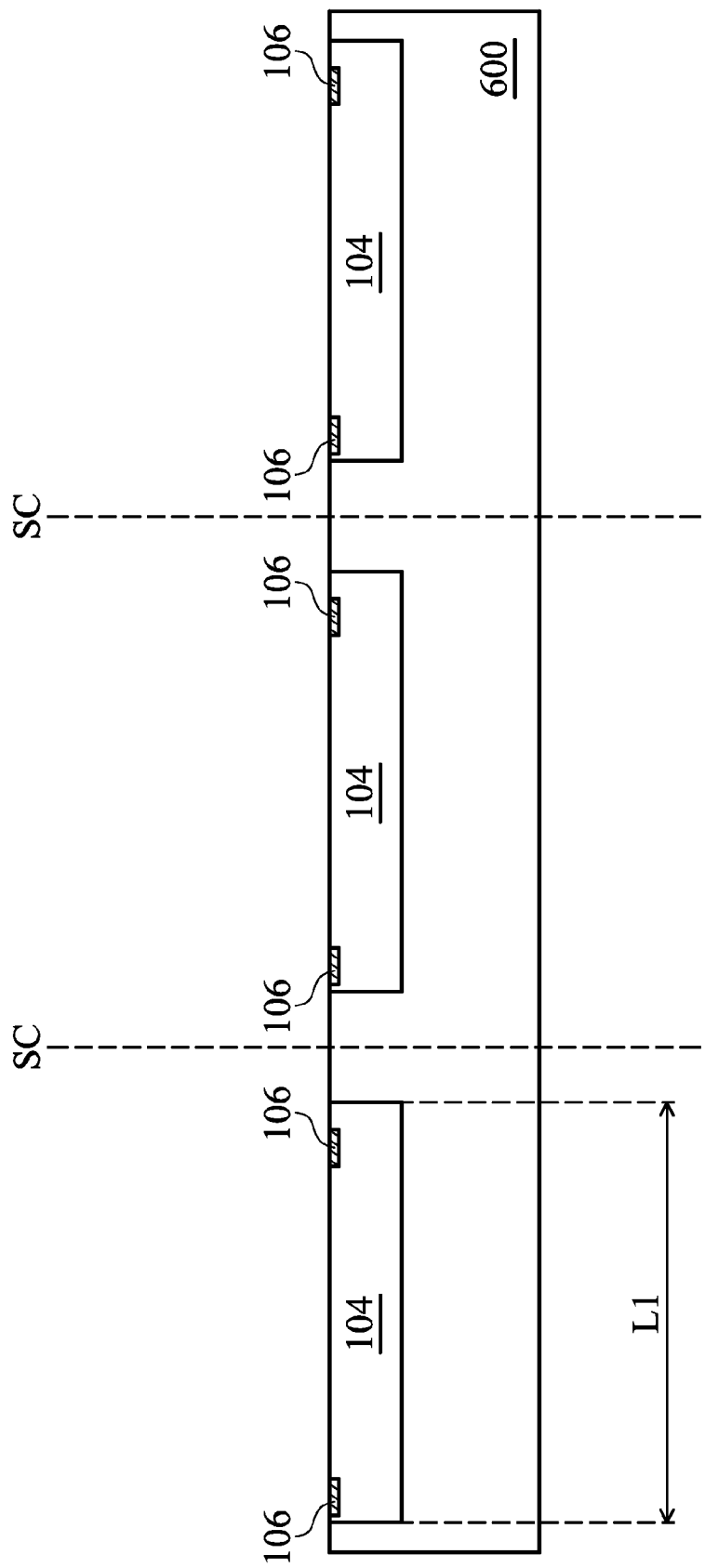
FIGS. 7A-7C are cross-sectional views showing the steps of forming a chip package according to an embodiment of the present invention.
Figure 7B:
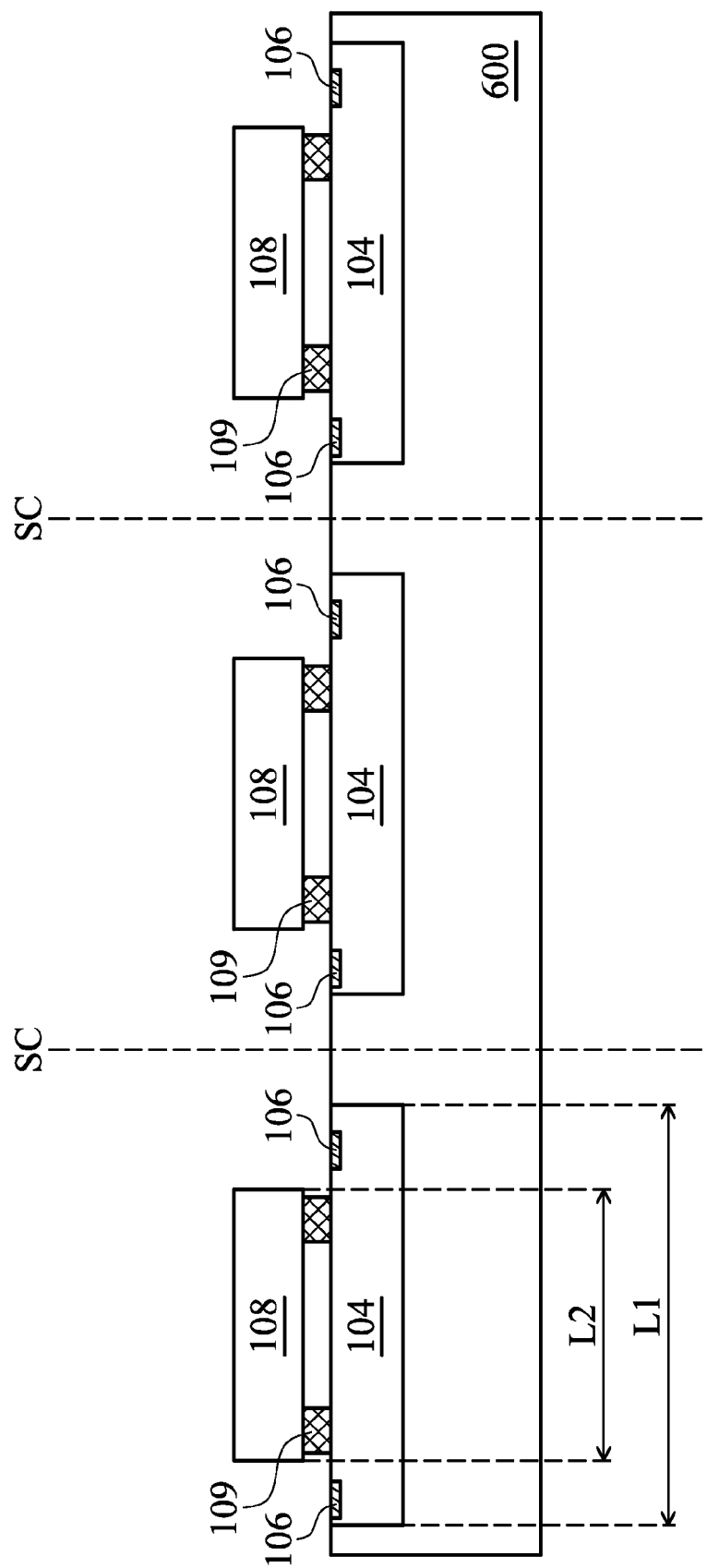
Figure 7C:
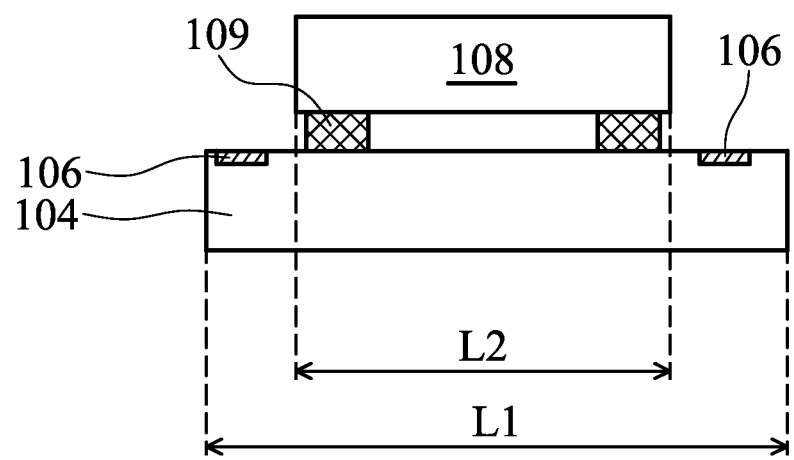

FIGS. 7A-7C are cross-sectional views showing the steps of forming a chip package according to an embodiment of the present invention. Similar to the embodiment shown in FIGS. 6A-6C, the embodiment shown in FIGS. 7A-7C also adopts a wafer-level packaging, wherein same or similar reference numbers are used to designate same or similar elements.

As shown in FIG. 7A, a semiconductor wafer 700 is provided, which includes a plurality of non-optical sensor chips 104. Each of the non-optical sensor chips 104 includes at least a second contact pad 106. Each of the non-optical sensor chips 104 has a first length L1.

Then, as shown in FIG. 7B, a plurality of protective caps 108 are disposed overlying the semiconductor wafer 700. For example, the protective caps 108 are respectively disposed overlying at least one of the non-optical sensor chips 104 through spacer structures 109. Each of the protective caps 108 has a second length L2. The extending direction of the second length L2 is substantially parallel to the extending direction of the first length L1. The second length L2 is shorter than the first length L1.

Then, the semiconductor wafer 700 is diced along predetermined scribe lines SC in FIG. 7B to separate the non-optical sensor chips 104. In addition, before or after the non-optical sensor chips 104 are separated, the semiconductor wafer 700 may be optionally ? to remove excess semiconductor wafer 700. The obtained separated non-optical sensor chips 104 are shown in FIG. 7C.

A following process is described with references made to FIG. 1. An IC chip 110 is disposed overlying one of the separated non-optical sensor chips 104 (such as that shown in FIG. 7C). The IC chip 110 is disposed overlying the protective cap 108 of one of the separated non-optical sensor chips 104. The IC chip 110 includes at least a third contact pad 112 and has a third length L3. The extending direction of the third length L3 is substantially parallel to the extending direction of the first length L1. In this embodiment, the third length L3 is shorter than the first length L1. However, in another embodiment, the third length L3 is longer than or equal to the first length L1 (such as that shown in FIG. 3 or 4).

Then, a substrate 100 is provided. The substrate 100 includes at least a first contact pad 102. One of the separated non-optical sensor chips 104 is disposed overlying the substrate 100. A plurality of bonding wires 114 are formed. The bonding wires 114 form electrical connections between the substrate 100, one of the separated non-optical sensor chips 104, and the IC chip 110. As shown in FIG. 1, a soldering ball 116 may be formed overlying the lower surface 100b of the substrate 100. In addition, it should be noted that the separated non-optical sensor chips 104 obtained in FIG. 7C may not only be packaged through the method shown in FIG. 1, but also may be packaged through any one of the methods shown in FIGS. 2-4.

By stacking the sensor chips and the IC chips and forming conducting routes between the sensor chips and the IC chips by bonding wires, area of the package substrate of the chip packages of the embodiment of the invention may be reduced, which benefit application in portable electronic products.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for forming a chip package, comprising:
   providing a substrate having an upper surface and a lower surface, wherein the substrate comprises at least a first contact pad;
   disposing a non-optical sensor chip overlying the upper surface of the substrate, wherein the non-optical sensor chip comprises at least a second contact pad and has a first length;
   disposing a spacer structure overlying the non-optical sensor chip;
   disposing a protective cap overlying the spacer structure, wherein the protective cap has a second length, an extending direction of the second length is substantially parallel to an extending direction of the first length, and the second length is shorter than the first length, wherein the spacer structure defines a space between the protective cap and the non-optical sensor chip, and wherein the protective cap, the spacer structure and the non-optical sensor chip together surround a sealed space;
   disposing an IC chip overlying the protective cap, wherein the IC chip comprises at least a third contact pad, the IC chip has a third length, and an extending direction of the third length is substantially parallel to the extending direction of the first length; and
   forming a plurality of bonding wires, wherein the bonding wires form electrical connections between the substrate, the non-optical sensor chip, and the IC chip.

2. The method for forming a chip package as claimed in claim 1, wherein the third length of the IC chip is shorter than the first length of the non-optical sensor chip.

3. The method for forming a chip package as claimed in claim 2, wherein one of the bonding wires electrically contacts one of the first contact pads and one of the third contact pads.

4. The method for forming a chip package as claimed in claim 2, wherein one of the bonding wires electrically contacts one of the second contact pads and one of the third contact pads.

5. The method for forming a chip package as claimed in claim 2, wherein one of the bonding wires electrically contacts one of the first contact pads and one of the second contact pads.

6. The method for forming a chip package as claimed in claim 1, wherein the third length of the IC chip is longer than or equal to the first length of the non-optical sensor chip.

7. The method for forming a chip package as claimed in claim 6, wherein one of the bonding wires electrically contacts one of the first contact pads and one of the third contact pads.

8. The method for forming a chip package as claimed in claim 6, wherein before the IC chip is disposed, one terminal of one of the bonding wires is electrically connected to one of the first contact pads, and after the IC chip is disposed, another terminal of the one of the bonding wires is electrically connected to one of the third contact pads.

9. The method for forming a chip package as claimed in claim 6, wherein one of the bonding wires electrically contacts one of the second contact pads and one of the third contact pads.

10. A method for forming a chip package, comprising:
providing a substrate, wherein the substrate comprises at least a first contact pad;
providing a semiconductor wafer comprising a plurality of non-optical sensor chips, wherein each of the non-optical sensor chips comprises at least a second contact pad, and each of the non-optical sensor chips has a first length;
disposing a spacer structure overlying the non-optical sensor chip;
disposing a plurality of protective caps overlying the spacer structure, wherein the protective caps are disposed overlying at least one of the non-optical sensor chips, respectively, each of the protective caps has a second length, an extending direction of the second length is substantially parallel to an extending direction of the first length, and the second length is shorter than the first length, wherein the spacer structure defines a space between the protective cap and the non-optical sensor chip, and wherein the protective cap, the spacer structure and the non-optical sensor chip together surround a sealed space;
disposing a plurality of IC chips overlying the semiconductor wafer, wherein the IC chips are disposed overlying one of the protective caps, respectively, each of the IC chips comprises at least a third contact pads and has a third length, and an extending direction of the third length is substantially parallel to the extending direction of the first length;
dicing the semiconductor wafer to separate the non-optical sensor chips;
disposing one of the separated non-optical sensor chips overlying the substrate; and
forming a plurality of bonding wires, wherein the bonding wires form electrical connections between the substrate, the separated non-optical sensor chip, and the IC chip.

11. A method for forming a chip package, comprising:
providing a substrate, wherein the substrate comprises at least a first contact pad;
providing a semiconductor wafer comprising a plurality of non-optical sensor chips, wherein each of the non-optical sensor chips comprises at least a second contact pad, and each of the non-optical sensor chips has a first length;
disposing a spacer structure overlying the non-optical sensor chip;
disposing a plurality of protective caps overlying the spacer structure, wherein the protective caps are disposed overlying at least one of the non-optical sensor chips, respectively, each of the protective caps has a second length, an extending direction of the second length is substantially parallel to an extending direction of the first length, and the second length is shorter than the first length;
dicing the semiconductor wafer to separate the non-optical sensor chips;
disposing an IC chip overlying one of the non-optical sensor chips, wherein the IC chip is disposed overlying the protective cap of one of the separated non-optical sensor chips, the IC chip comprises at least a third contact pad and has a third length, and an extending direction of the third length is substantially parallel to the extending direction of the first length, wherein the spacer structure defines a space between the protective cap and the non-optical sensor chip, and wherein the protective cap, the spacer structure and the non-optical sensor chip together surround a sealed space;
disposing one of the separated non-optical sensor chips overlying the substrate; and
forming a plurality of bonding wires, wherein the bonding wires form electrical connections between the substrate, the separated non-optical sensor chip, and the IC chip.

\* \* \* \* \*